(12) United States Patent
Delshadpour

(10) Patent No.: US 11,296,667 B1
(45) Date of Patent: Apr. 5, 2022

(54) TWO-DIMENSIONAL CONTINUOUS-TIME LINEAR EQUALIZER FOR HIGH-SPEED APPLICATIONS

(71) Applicant: NXP B.V., Eindhoven (NL)

(72) Inventor: Siamak Delshadpour, Phoenix, AZ (US)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 17/084,528

(22) Filed: Oct. 29, 2020

(51) Int. Cl.
    *H03F 3/45* (2006.01)
    *H03G 3/30* (2006.01)
    *H03F 1/32* (2006.01)
    *H03G 1/00* (2006.01)

(52) U.S. Cl.
    CPC ............... *H03G 3/30* (2013.01); *H03F 1/32* (2013.01); *H03F 3/45098* (2013.01); *H03G 1/0023* (2013.01); *H03G 2201/103* (2013.01)

(58) Field of Classification Search
CPC .. H03G 3/30; H03G 2201/103; H03G 1/0023; H03G 1/0088; H03F 1/32; H03F 3/45098; H03F 3/45; H03F 3/45183
USPC .......................................................... 330/254
See application file for complete search history.

(56) References Cited

U.S. PATENT DOCUMENTS

| | | | | |
|---|---|---|---|---|
| 4,888,560 A * | 12/1989 | Ogura | ................ | H03G 5/28 330/254 |
| 5,514,950 A * | 5/1996 | Sevenhans | ............ | H03F 1/3211 323/312 |
| 6,100,760 A * | 8/2000 | Maruyama | ........... | H03G 1/0023 327/359 |
| 6,525,606 B1 * | 2/2003 | Atkinson | ................. | H03G 7/06 327/359 |
| 6,710,659 B2 * | 3/2004 | Teramoto | ............ | H03F 3/45103 327/52 |
| 10,447,507 B1 * | 10/2019 | Zhang | ............... | H04L 25/03019 |
| 2006/0232334 A1 * | 10/2006 | Rosener | ............... | H03G 1/0023 330/254 |

OTHER PUBLICATIONS

Zhang, Guangyu Evelina et al. "A 10 GB/s BiCMOS Adaptive Cable Equalizer", IEEE Journal of Solid-State Circuits, vol. 40, No. 11, Nov. 2005, pp. 2132-2140.

(Continued)

*Primary Examiner* — Khanh V Nguyen

(57) ABSTRACT

Embodiments of a linear equalizer are disclosed. In an embodiment, a linear equalizer includes a plurality of input transistors, a plurality of gain control transistors and first and second impedance elements. The plurality of input transistors is connected to input terminals of the linear equalizer to receive input signals. The plurality of gain control transistors is connected between a supply voltage and the plurality of input transistors. The plurality of gain control transistors is also connected to gain control terminals to receive gain control signals. At least some of the gain control transistors are connected to output terminals of the linear equalizer to transmit output signals. The first and second impedance elements are connected between at least some of the input transistors and at least one fixed voltage. A peaking gain of the linear equalizer is defined by gain control signals applied to the gain control terminals.

19 Claims, 4 Drawing Sheets

(56) References Cited

OTHER PUBLICATIONS

Liu, Hao et al. "An HDMI Cable Equalizer With Self-Generated Energy Ratio Adaptation Scheme", IEEE Transactions on Circuits and Systems—II: Express Briefs, vol. 56, No. 7, Jul. 2009, 5 pgs.
Rogers Sr., Edwards S. "A Cable Equalizer with 31 dB of Adjustable Peaking at 52 GHz", IEEE, 2008, pp. 154-157.
U.S. Appl. No. 16/875,854; 23 pages (May 18, 2020).
U.S. Appl. No. 16/876,691; 20 pages (May 18, 2020).
U.S. Appl. No. 16/876,970; 18 pages (May 18, 2020).

* cited by examiner

TWO-DIMENSIONAL CONTINUOUS-TIME LINEAR EQUALIZER FOR HIGH-SPEED APPLICATIONS

BACKGROUND

Continuous-time linear equalizers (CTLEs) are employed at the receiver front end to compensate for channel loss and to provide an equalized low-jitter output data. Unlike non-linear equalizers, such as decision-feedback equalizers, which only provide postcursor equalization, CTLEs ensure precursor equalization as well as postcursor equalization.

Due to the nature of loss and incoming wideband signal, some programmability with DC (low frequency output) gain and/or peaking gain may be needed for a CTLE to provide better equalization. However, designing an efficient CTLE with programmable DC gain and/or peaking gain is challenging due to various factors that must be considered.

SUMMARY

Embodiments of a linear equalizer are disclosed. In an embodiment, a linear equalizer includes a plurality of input transistors, a plurality of gain control transistors and first and second impedance elements. The plurality of input transistors is connected to input terminals of the linear equalizer to receive input signals. The plurality of gain control transistors is connected between a supply voltage and the plurality of input transistors. The plurality of gain control transistors is also connected to gain control terminals to receive gain control signals. At least some of the gain control transistors are connected to output terminals of the linear equalizer to transmit output signals. The first and second impedance elements are connected between at least some of the input transistors and at least one fixed voltage. A peaking gain of the linear equalizer is defined by gain control signals applied to the gain control terminals.

In an embodiment, the input terminals are connected to control terminals of the input transistors and the gain control terminals are connected to control terminals of the gain control transistors.

In an embodiment, the linear equalizer further includes a first capacitor connected to a first node between a first pair of the gain control transistors and a first transistor of the plurality of input transistors, the first capacitor also being connected to a second node between a second pair of the gain control transistors and a second transistor of the plurality of input transistors.

In an embodiment, the linear equalizer further includes a second capacitor connected to the first node and a fixed voltage and a third capacitor connected to the second node and the fixed voltage.

In an embodiment, the second and third capacitors are variable capacitors.

In an embodiment, the first impedance element includes a plurality of resistors that are connected in series from a first transistor of the plurality of input transistors to a second transistor of the plurality of input transistors.

In an embodiment, at least one of the plurality of resistors is a variable resistor.

In an embodiment, the second impedance element includes a plurality of additional resistors, a plurality of capacitors and an inductor that are connected to third and fourth transistors of the plurality of input transistors.

In an embodiment, at least some of the capacitors and the inductor are connected in series from the third transistor of the plurality of input transistors to the fourth transistor of the plurality of input transistors.

In an embodiment, at least some of the additional resistors and at least one of the capacitors are connected in series from the third transistor of the plurality of input transistors to the fourth transistor of the plurality of input transistors, and parallel to the at least some of the capacitors and the inductor.

In an embodiment, some of the additional resistors are connected in series from the third transistor of the plurality of input transistors to the fourth transistor of the plurality of input transistors, and parallel to the at least some of the additional resistors and at least one of the capacitors.

In an embodiment, at least one of the some of the additional resistors is a variable resistor.

In an embodiment, the linear equalizer further includes a plurality of current sources connected to the plurality of input transistors and to at least one fixed voltage.

In an embodiment, a linear equalizer includes a plurality of input transistors, a plurality of gain control transistors, a plurality of current sources and first and second impedance elements. The plurality of input transistors is connected to input terminals of the linear equalizer to receive input signals. The plurality of gain control transistors is connected between a supply voltage and the plurality of input transistors. The plurality of gain control transistors is also connected to gain control terminals to receive gain control signals. At least some of the gain control transistors are connected to output terminals of the linear equalizer to transmit output signals. Each output terminal is also connected to a termination resistor that is connected to the supply voltage. The plurality of current sources is connected between the plurality of input transistors and at least one fixed voltage. The first and second impedance elements are connected between at least some of the input transistors and the at least one fixed voltage. A peaking gain of the linear equalizer is defined by gain control signals applied to the gain control terminals.

In an embodiment, the input terminals are connected to control terminals of the input transistors and the gain control terminals are connected to control terminals of the gain control transistors.

In an embodiment, the linear equalizer further includes a first capacitor connected to a first node between a first pair of the gain control transistors and a first transistor of the plurality of input transistors, the first capacitor also being connected to a second node between a second pair of the gain control transistors and a second transistor of the plurality of input transistors.

In an embodiment, the linear equalizer further includes a second capacitor connected to the first node and a fixed voltage and a third capacitor connected to the second node and the fixed voltage.

In an embodiment, the first impedance element includes a plurality of resistors that are connected in series from a first transistor of the plurality of input transistors to a second transistor of the plurality of input transistors.

In an embodiment, the second impedance element includes a plurality of additional resistors, a plurality of capacitors and an inductor that are connected to third and fourth transistors of the plurality of input transistors.

In an embodiment, a differential linear equalizer includes four input transistors, eight gain control transistors, four current sources and first and second impedance elements. The four input transistors are connected to a pair of input terminals of the differential linear equalizer to receive input signals. The eight gain control transistors are connected between a supply voltage and the four input transistors. The eight gain control transistors are also connected to a pair of gain control terminals to receive gain control signals. At least some of the eight gain control transistors are connected to a pair of output terminals of the differential linear equalizer to transmit output signals. The four current sources are connected between the four input transistors and ground. The first and second impedance elements are connected between at least some of the four input transistors and the ground. A peaking gain of the differential linear equalizer is defined by gain control signals applied to the pair of gain control terminals.

These and other aspects in accordance with embodiments will become apparent from the following detailed description, taken in conjunction with the accompanying drawings, illustrated by way of example of the principles of the embodiments.

BRIEF DESCRIPTION OF THE DRAWINGS

Throughout the description, similar reference numbers may be used to identify similar elements.

DETAILED DESCRIPTION

Figure 1:
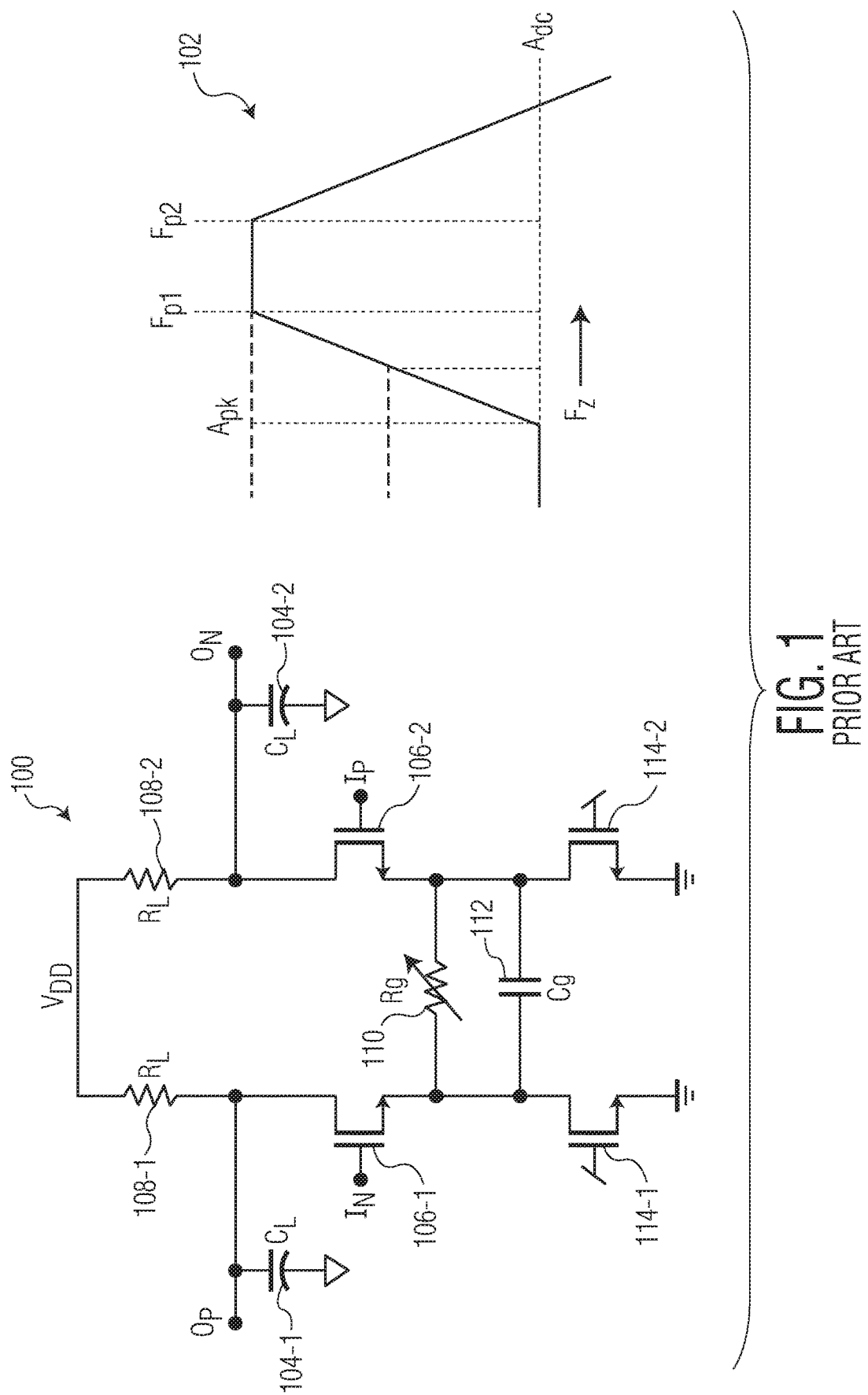
FIG. 1 shows a circuit diagram of a conventional continuous-time linear equalizer (CTLE) and its transfer function in accordance with prior art.

It will be readily understood that the components of the embodiments as generally described herein and illustrated in the appended Figs. could be arranged and designed in a wide variety of different configurations. Thus, the following more detailed description of various embodiments, as represented in the Figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the embodiments is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

The goal of an equalizer is to realize a transfer function which can be tuned such that it is inverse of the channel transfer function. If properly tuned, the equalizer improves the receiver performance parameters, such as bit error rate (BER) and jitter tolerance. A conventional capacitive source-degenerated first order CTLE with one zero and two poles provides limited capability to control the shape of CTLE transfer function.

FIG. 1 shows a conventional CTLE 100 and its transfer function 102 in accordance with prior art. The conventional CTLE circuit 100 includes input ports $I_N$ and $I_P$ and output ports $O_P$ and $O_N$. The output port $O_P$ is coupled to a capacitor 104-1 with a capacitance value of $C_L$ that is coupled to ground. Similarly, the output port $O_N$ is coupled to a capacitor 104-2 with a capacitance value of $C_L$ that is coupled to ground. The input port $I_N$ is coupled with the gate of an NMOS transistor 106-1 and the input port $I_P$ is coupled with the gate of an NMOS transistor 106-2. The drain of the NMOS transistor 106-1 is connected to a resistor 108-1 with a resistance value of $R_L$, which is connected to a supply voltage $V_{DD}$. The drain of the NMOS transistor 106-2 is connected to a resistor 108-2 with a resistance value of $R_L$, which is also connected to the supply voltage $V_{DD}$. The sources of the NMOS transistors 106-1 and 106-2 are coupled together via a variable resistor 110 with a resistance value of Rg and a capacitor 112 with a capacitance value of Cg. The resistor 110 and the capacitor 112 are coupled with each other in parallel. The source of the NMOS transistor 106-1 is also connected to an NMOS transistor 114-1, which is connected to ground. The source of the NMOS transistor 106-2 is also connected to an NMOS transistor 114-2, which is also connected to ground.

The transfer function 102 of the CTLE 100 shows the DC gain $A_{dc}$ and the maximum gain $A_{pk}$ at a frequency ($F_z$) range of $F_{p1}$ to $F_{p2}$. The DC gain and transfer function of the CTLE 100 can be written as:

$$A_{dc}=R_L/(R_g+1/g_m) \tag{1}$$

$$H(s) \approx A_{dc}(1+s\ R_g C_g)/((1+2s\ C_g/g_m)(1+s\ R_L C_L)) \tag{2}$$

where $g_m/2$ is transconductance of differential pair transistors 106-1 and 106-2. As it can be seen from equation (1), $R_g$ adjustment will change DC gain and zero location. It is difficult to get high peaking gain and equal gain steps from this conventional architecture. The maximum AC gain will be:

$$A_{AC}=g_m*R_L \tag{3}$$

Although the CTLE 100 is shown as a complementary metal-oxide-semiconductor (CMOS) based circuit in FIG. 1, a corresponding bipolar junction transistor (BJT) based circuit of the CTLE 100 would also follow the same rules.

To tune this type of a CTLE, the resistor 110 would need to be changed to a different source degeneration resistor for the CMOS circuit or a different emitter degeneration resistor for the BJT circuit. In this way, the DC attenuation will be changed while the AC gain is fixed (Maximum AC gain=$g_m$*$R_L$), so that one can get different peaking for the CTLE (peaking gain=AC gain-DC gain). A problem with this conventional structure is when only the degeneration resistor is changed, the zero frequency will be changed because the zero created by degeneration RC pair ($\omega_{zero}$=1/$R_g$ $C_g$) while the capacitor is fixed. To keep the zero frequency fixed, $R_g$ and $C_g$ need to be tuned/adjusted to get different peaking gain and maintain the same zero frequency. Also, changing Rg will change the gain that may require a gain stage after CTLE to compensate the gain change. Additional gain stage will be a high bandwidth (programmable) amplifier, which will cost extra power.

However, for high speed applications, this tuning method can cause problems. Due to parasitic components, using discrete tuning steps means there should be different resistor and capacitor settings for each step. In a real circuit, the switches of all these steps will introduce parasitic resistance and capacitance. These parasitic resistance and capacitance cannot be well controlled and will cause unexpected peaking at low frequency or reduce the expected tuning range because the parasitic resistor and capacitor need to be calculated into the total amount of possible capacitors and resistors for the tuning part. Thus, the actual tuning range will be reduced by the parasitic.

If using a varactor as the tuning capacitor, it will introduce less parasitic to the circuit. However, the tuning is not predictable because the exact value of the varactor is unknown. Adding another tuning/trimming for the varactor is expensive and adds more parasitic components.

To have a CTLE with the right peaking gain control for high-frequency applications, a better solution is needed. It is noted here that cascading two conventional CTLEs results in variation of peaking gain over process, voltage temperature (PVT) will be twice of a single stage CTLE.

Figure 2:
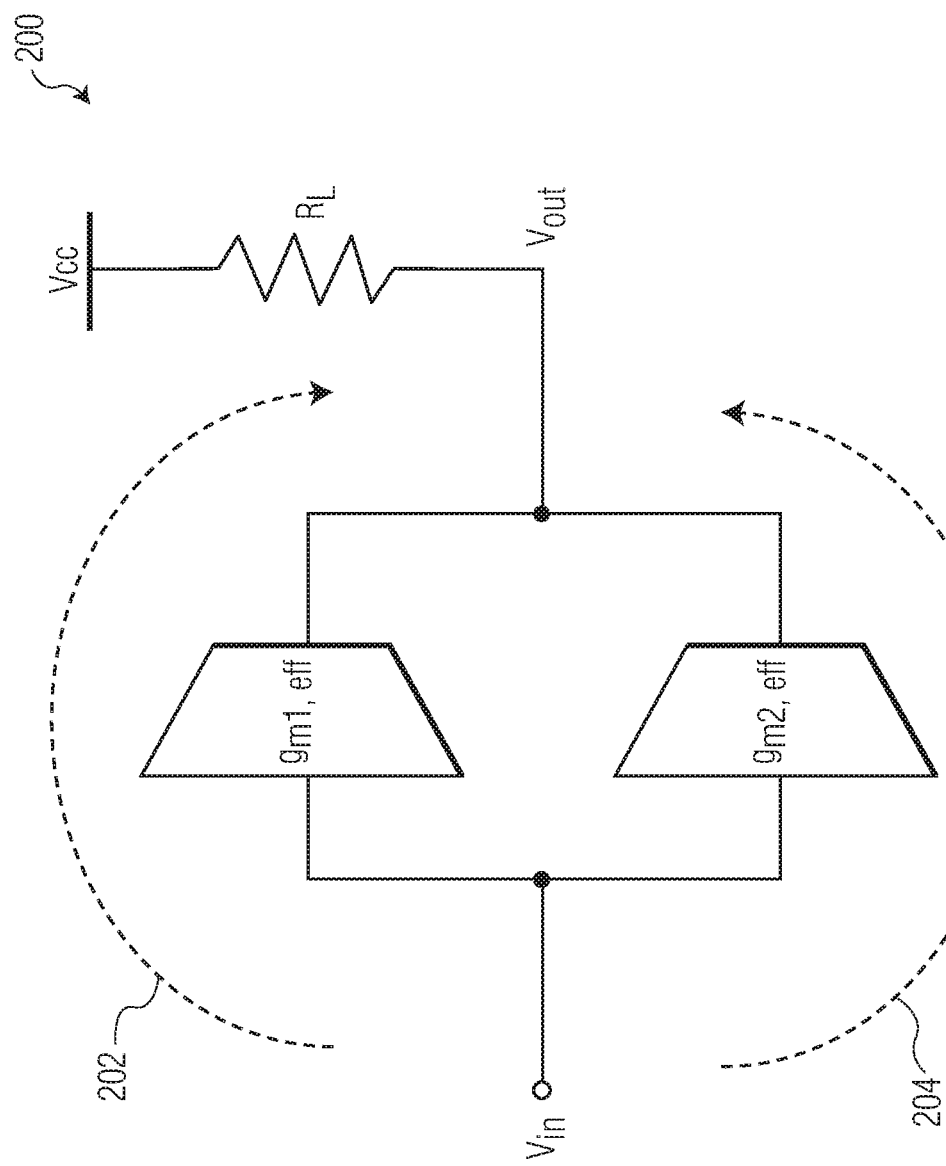
FIG. 2 is a block diagram that illustrates a working principle of a two-dimensional CTLE with improved peaking control for high-frequency applications in accordance with an embodiment of the invention.

The working principle of a two-dimensional CTLE with improved peaking control for high-frequency applications in accordance with an embodiment of the invention is illustrated in FIG. 2. The CTLE 200 includes two parallel signal paths 202 and 204, which have different "effective $g_m$ transfer functions". The signal path 202 has an effective $g_m$ transfer function of $g_{m1,eff}$ and the signal path 204 has an effective $g_m$ transfer function of $g_{m2,eff}$.

In theory, the path 202 can be the DC path and the path 204 can be the high frequency path. The path 202 has no or low peaking gain, which is referred as "flat band". This path sets the low frequency gain for the CTLE 200. It exhibits low pass feature with the bandwidth slightly greater than the Nyquist frequency of the data signal.

The other path 204 provides the gain peaking for the CTLE 200. Through a weighted summation of the two signal paths, the equalizer peaking gain is programmable from 0 dB, or flat band gain, to a maximum peaking gain available from the gain peaking path.

Considering a scheme which can keep $g_{m1}+g_{m2}=G_m$, a constant value, and making:

$$g_{m1,eff} = \frac{g_{m1}}{1+(g_{m1}+g_{m2})Z_{E1}} \quad (4)$$

$$g_{m2,eff} = \frac{g_{m2}}{1+(g_{m1}+g_{m2})Z_{E2}}, \quad (5)$$

where $g_{m1}$ and $g_{m2}$ are already defined in form of $g_{m1}$+$g_{m2}$=$G_m$ and changing their values will apply different weight to each of the $g_{m1,eff}$ and $g_{m2,eff}$. Also, $Z_{E1}$ and $Z_{E2}$ are degeneration impedances and their order can be one of the variables which shape the overall CTLE AC response (for more details, see U.S. patent application Ser. No. 16/876,970, titled "Continuous Time Linear Equalization Circuit", which is incorporated herein by reference). $V_{out}$ can be achieved as:

$$\frac{v_{out}}{v_{in}} = (g_{m1,eff} + g_{m2,eff})R_L \quad (6)$$

Or with more details in the form of:

$$\frac{v_{out}}{v_{in}} = \frac{g_{m1}R_L}{1+(g_{m1}+g_{m2})Z_{E1}} + \frac{g_{m2}R_L}{1+(g_{m1}+g_{m2})Z_{E2}} \quad (7)$$

For a fixed and maximum CTLE peaking gain, $g_{m1,eff}$ will stay at its minimum value and $g_{m2,eff}$ will stay at its maximum value (which are set by $g_{m1}$ and $g_{m2}$ that are selected by design and follow: $g_{m1}+g_{m2}=G_m$). Each of the 2 needed $g_m$ cells, $g_{m1,eff}$ and $g_{m2,eff}$, needs to be implemented in form of what was shown in equations (4) and (5).

Figure 3:
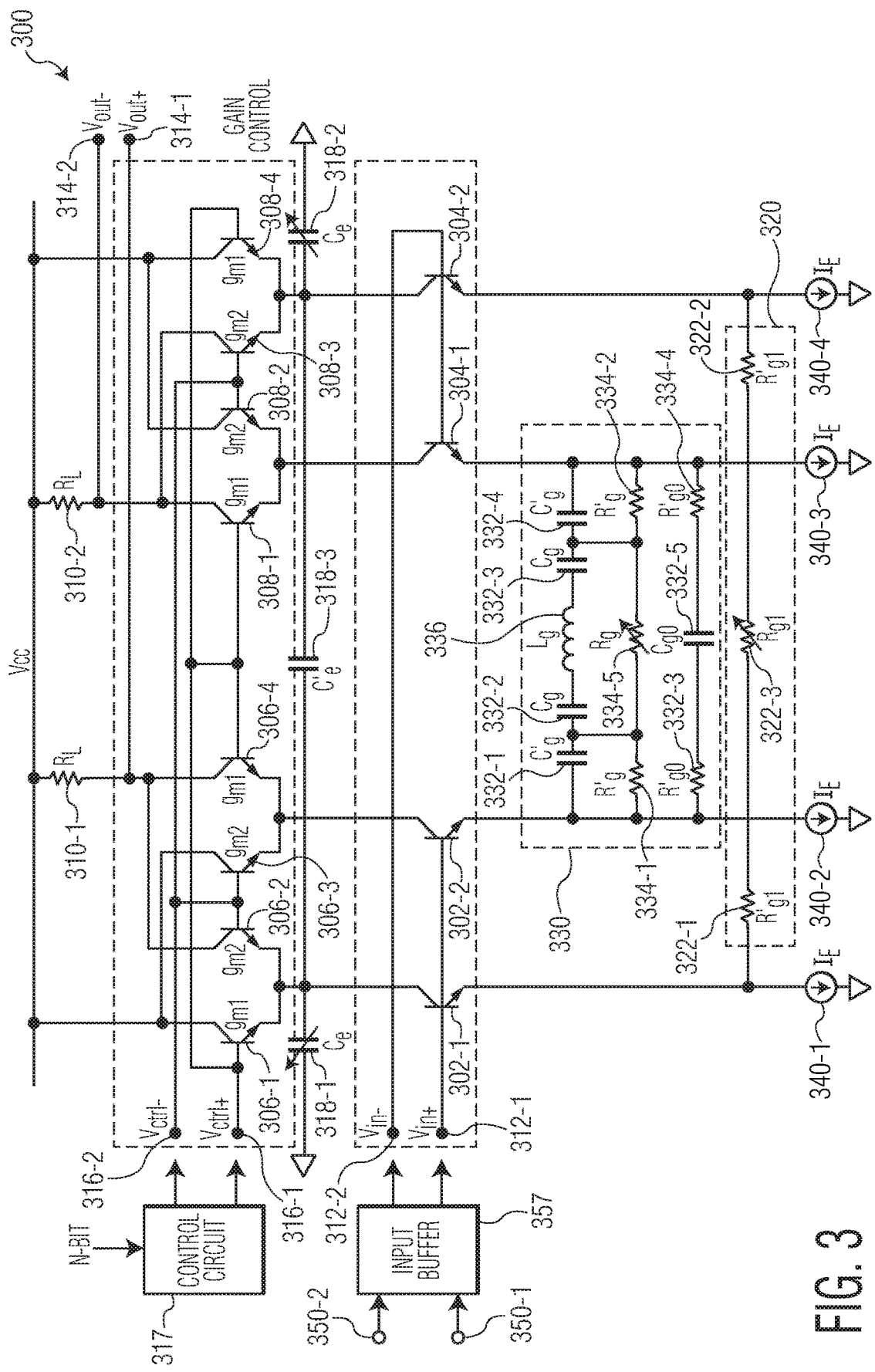
FIG. 3 is a schematic circuit diagram of a differential linear equalizer in accordance with embodiments of the invention.

FIG. 3 is a schematic circuit diagram of a differential continuous-time linear equalizers (CTLEs) 300 in accordance with an embodiment of the invention. In the embodiment depicted in FIG. 3, the differential CTLE 300 includes a first set of transistors 302-1 and 302-2, a second set of transistors 304-1 and 304-2, a first set of gain control transistors 306-1, 306-2, 306-3 and 306-4, a second set of gain control transistors 308-1, 308-2, 308-3 and 308-4, two resistors 310-1 and 310-2, and first and second impedance elements 320, 330. The differential CTLE 300 depicted in FIG. 3 uses transistors that are all electrically connected between a supply voltage, $V_{CC}$, and a fixed voltage (e.g., ground).

In the embodiment depicted in FIG. 3, the differential CTLE 300 includes input terminals 312-1 and 312-2 that receive first and second input signals $V_{in+}$ and $V_{in-}$ and output terminals 314-1 and 314-2 that provide output signals at output terminals 314-1 and 314-2. The control terminals (e.g., the base or gate) of the first set of transistors 302-1 and 302-2 are electrically connected to the input terminal 312-1, and the control terminals of the second set of transistors 304-1 and 304-2 are electrically connected to the input terminal 312-2. The gain control transistors 306-1 and 306-2 are connected to the supply voltage $V_{CC}$ and to the transistor 302-1, and the gain control transistors 306-3 and 306-4 are connected to the supply voltage $V_{CC}$ and to the transistor 302-2. Similarly, the gain control transistors 308-1 and 308-2 are connected to the supply voltage $V_{CC}$ and to the transistor 304-1, and the gain control transistors 308-3 and 308-4 are connected to the supply voltage $V_{CC}$ and to the transistor 304-2. The gain control transistors 308-1, 308-3, 308-5 and 308-3 are directly connected to the supply voltage $V_{CC}$. However, the gain control transistors 308-2 and 308-4 are connected to the supply voltage $V_{CC}$ via the resistor 310-1, and the gain control transistors 308-1 and 308-3 are connected to the supply voltage $V_{CC}$ via the resistor 310-2. The output terminal 314-1 is connected to a node between the resistor 310-1 and the gain control transistors 308-2 and 308-4, and the output terminal 314-2 is connected to a node between the resistor 310-2 and the gain control transistors 308-1 and 308-3.

In the embodiment depicted in FIG. 3, each of the gain control transistors 306-1, 306-2, 306-3, 306-4, 308-1, 308-2, 308-3 and 308-4 has one of two transconductance values $g_{m1}$ and $g_{m2}$. Specifically, the gain control transistors 306-1, 306-4, 308-1 and 308-4 have a transconductance value of $g_{m1}$, and the gain control transistors 306-2, 306-3, 308-2 and 308-3 have a transconductance value of $g_{m1}$.

The differential CTLE 300 further includes control signal terminals 316-1 and 316-2 that receive first and second control signals $V_{ctrl+}$ and $V_{ctrl-}$. The control signal terminal 316-1 is connected to the control terminals of the gain control transistors 306-1, 306-4, 308-1 and 308-4, and the control signal terminal 316-2 is connected to the control terminals of the gain control transistors 306-2, 306-3, 308-2 and 308-3. The control signals $V_{ctrl+}$ and $V_{ctrl-}$ are from an external control circuit 317 that receives an input signal of N bits, where N is a positive integer, and generates the control signals $V_{ctrl+}$ and $V_{ctrl-}$ based on the input signal.

The gain control transistors 306-1 and 306-2 are also connected to a capacitor 318-1 with a capacitance value of $C_e$, which is connected to a fixed voltage (e.g., ground). Similarly, the gain control transistors 308-3 and 308-4 are also connected to a capacitor 318-2 with a capacitance value of $C_e$, which is also connected to a fixed voltage (e.g., ground). Specifically, the capacitor 318-1 is connected to a node between the gain control transistors 306-1 and 306-2 and the transistor 302-1, and the capacitor 318-2 is connected to a node between the gain control transistors 308-3 and 308-4 and the transistor 304-2. In an embodiment, the capacitors 318-1 and 318-2 may be variable capacitors. The gain control transistors 306-1 and 306-2 are also connected to a capacitor 318-3 with a capacitance value of $C'_e$, which is also connected to the gain control transistors 308-3 and 308-4.

As shown in FIG. 3, the first and second sets of transistors 302-1, 302-2, 304-1 and 304-2 are electrically connected to a fixed voltage (e.g., ground) through current sources 340-1, 340-2, 340-3, 340-4. The first impedance element 320 is connected to a node between the transistor 302-1 and the current source 340-1 and to a node between the transistor 304-2 and the current source 340-4. In the illustrated embodiment, the first impedance element 320 includes two resistors 322-1 and 322-2 with a resistance value of $R'_{g1}$ and a third resistor 322-3 with a resistance value of $R_{g1}$, which are connected in series from the node between the transistor 302-1 and the current source 340-1 to the node between the transistor 304-2 and the current source 340-4. The resistor 322-3 may be an adjustable resistor.

The second impedance element 330 is connected to the transistors 302-2 and 304-1 and the current sources 340-2 and 340-3. In the illustrated embodiment, the second impedance element 330 includes two capacitors 332-1 and 332-3 with a capacitance value of $C'_g$, two capacitors 332-2 and 332-4 with a capacitance value of $C_g$, and a capacitor 332-5 with a capacitance value of $C_{g0}$. The second impedance element 330 further includes two resistors 334-1 and 334-2 with a resistance value of $R'_g$, two resistors 334-3 and 334-4 with a resistance value of $R'_{g0}$, and a resistor 334-5 with a resistance value of $R_g$. The resistor 334-5 may be an adjustable resistor. The second impedance element 330 also includes an inductor 336 with inductance value of $L_q$.

The capacitors 332-1, 332-2, 332-3 and 332-4 and the inductor 336 are connected in series from a node between the transistor 302-2 and the current source 340-2 to a node between the transistor 304-1 and the current source 340-3. The resistors 334-1, 334-2 and 334-3 are also connected in series from a node between the transistor 302-2 and the current source 340-2 to a node between the transistor 304-1 and the current source 340-3. The resistors 334-1 and 334-5 are also connected to the capacitors 332-1 and 332-2, and the resistors 334-2 and 334-5 are also connected to the capacitors 332-3 and 332-4. Specifically, a node between the capacitor 332-1 and the capacitor 332-2 is connected to a node between the resistor 334-1 and the resistor 334-5, and a node between the capacitor 332-3 and the capacitor 332-4 is connected to a node between the resistor 334-5 and the resistor 334-2.

The transistors 302-1, 302-2, 304-1 and 304-2 provide main signal paths for input signals on the input terminals 312-1 and 312-2, which may be coming directly from input pins 350-1 and 350-2 or through an input buffer 357 located between the input pins 350-1 and 350-2 and the input terminals 312-1 and 312-2. The input buffer 357 may or may not be used depending on the DC level, input impedance and chip architecture.

The second impedance element 330 shapes the high order impedance, $Z_{E2}$, where "$Z_{E2} \sim (L_g + 2C_g) \| R_g$" shapes the second order (or higher order, as explained in U.S. patent application Ser. No. 16/876,970, titled "Continuous Time Linear Equalization Circuit") form of it. The resistors 334-1 and 334-2 and the capacitors 332-1 and 332-4 may include parasitic portions, but they can be added as part of the main $Z_{E2}$ impedance. The quality factor of the inductor 336 of the second impedance element 330 should be maximized to avoid peaking gain loss due to lossy second order response.

The impedance $Z_{E1}$ of the first element 320 is shaped by "$R_{g1} + 2 R'_{g1}$", which is a zero-order impedance to shape the flat gain part. It can have a pole at higher frequency to help the shape of the CTLE 300. Both the resistor 334-5 and the resistor 322-6, which shape the "low frequency" or DC gain of the CTLE 300, can be programmable to provide different DC gain, where the overall DC gain will be equal to:

$$\frac{v_{out}}{v_{in}}(DC) = \frac{g_{m1} R_L}{1 + (g_{m1} + g_{m2}) R_g} + \frac{g_{m2} R_L}{1 + (g_{m1} + g_{m2}) R_{g1}}$$

Each current passing through the transistors 302-1, 302-2, 304-1 and 304-2 is equal to $I_E$. These currents $I_E$ go through four differential pairs of gain control transistors, the first differential pair of transistors 306-1 and 306-2, the second differential pair of transistors 306-3 and 306-4, the third differential pair of transistors of 308-1 and 308-2, and the fourth differential pair of transistors 308-3 and 308-4. Knowing that $g_m$ of a bipolar transistor is equal to $\sim I_C/V_T$, the total $g_m$ of each of the four pairs is equal, which is what is needed, i.e., "$g_{m1} + g_{m2}$=Constant". Control voltage, $V_{ctrl}$ defines the ratio of $g_{m1}$ and $g_{m2}$ to define the peaking gain value (different $V_{ctrl}$ provides different peaking gain). The collector current of the gain control transistors 306-2 and 306-4 goes to the termination resistor 310-1 as one of the two main signal outputs. Similarly, the collector current of the gain control transistors 308-1 and 308-3 goes to the termination resistor 310-2 as the other signal output of the two main signal outputs. The collector current of the transistors 306-1 and 306-3 and the collector current of the transistors 308-2 and 308-4 act as balance currents to provide the $g_m$ ratio. The transistors 306-1, 306-4, 308-1 and 308-4 generate $g_{m1}$, and the transistors 306-2, 306-3, 308-2 and 308-3 generate $g_{m2}$.

The capacitors 318-1 and 318-2 (which can be programmable) and the capacitor 318-3 are added to provide extra pole at the emitters of the transistors 306-1, 306-2, 308-3 and 308-4 for better CTLE shape control.

The voltages of the control signals $V_{ctrl+}$ and $V_{ctrl-}$ on the control signal terminals 316-1 and 316-2 can be fixed (i.e., fixed voltages) to control base voltages of the transistors 306-1, 306-2, 306-3, 306-4, 308-1, 308-2, 308-3 and 308-4 for a fixed peaking gain or a programmable or variable (i.e., variable voltages) to provide programmable peaking gain. The maximum AC gain will be $\sim g_{m2}*R_L$ when $Z_{E2} \sim 0$ at peaking frequency and $g_{m1}$ at its minimum value ($g_{m2}=G_m-g_{m1} \sim G_m$). In an embodiment, the control circuit 317 may utilize a fine resolution digital-to-analog converter to provide the control signals with the desired voltages, which may be fixed or variable defined by the input N-bit digital signal applied to the control circuit.

The low pass path of the CTLE 300 has a bandwidth slightly greater than the Nyquist frequency of the data signal. The high pass path of the CTLE 300 provides the gain peaking for the CTLE with peaking frequency at the Nyquist frequency if "a calibration is planned" and higher than Nyquist frequency if "no calibration is planned" to consider the PVT variation to guarantee a bandwidth higher than the Nyquist frequency all the time.

Although the CTLE 300 has been illustrated and described as being implemented using BJT technology, the CTLE 300 may be implemented using complementary metal-oxide-semiconductor (CMOS) technology with N-type MOS (NMOS) and/or P-type MOS (PMOS) transistors in accordance with an embodiment of the invention is shown.

Figure 4:
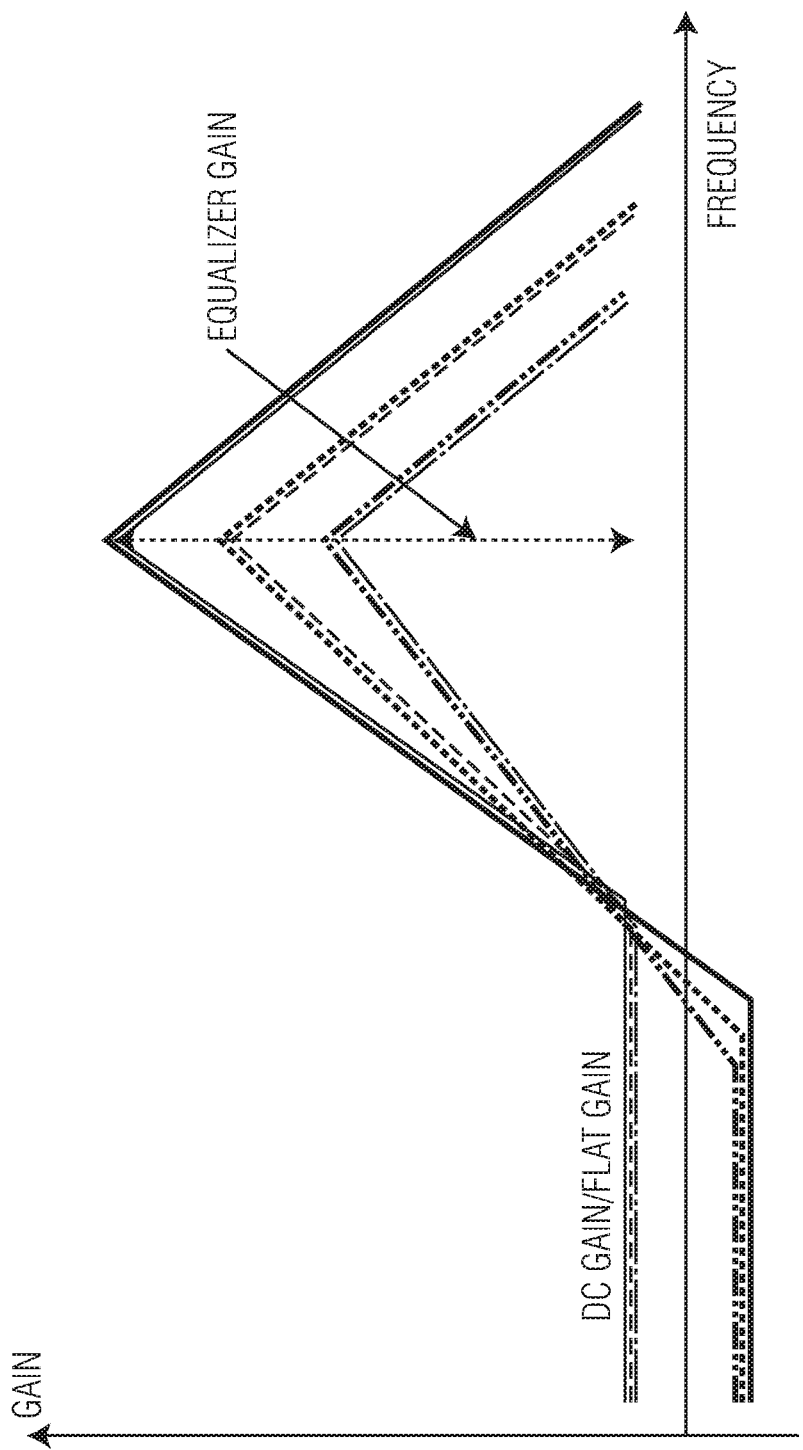
FIG. 4 shows possible gain curves of the CTLE depicted in FIG. 3 in accordance with an embodiment of the invention.

FIG. 4 shows possible gain curves of the CTLE 300 in accordance with an embodiment of the invention. As illustrated in FIG. 4, different peaking gains will occur using different $V_{ctrl}$ voltages. Different DC gain will occur changing $R_{g1}$ and $R_g$ values, as described earlier.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It can also be noted that at least some of the operations for the methods described herein may be implemented using software instructions stored on a computer useable storage medium for execution by a computer. As an example, an embodiment of a computer program product includes a computer useable storage medium to store a computer readable program.

The computer-useable or computer-readable storage medium can be an electronic, magnetic, optical, electromagnetic, infrared, or semiconductor system (or apparatus or device). Examples of non-transitory computer-useable and computer-readable storage media include a semiconductor or solid-state memory, magnetic tape, a removable computer diskette, a random-access memory (RAM), a read-only memory (ROM), a rigid magnetic disk, and an optical disk. Current examples of optical disks include a compact disk with read only memory (CD-ROM), a compact disk with read/write (CD-R/W), and a digital video disk (DVD).

Alternatively, embodiments of the invention may be implemented entirely in hardware or in an implementation containing both hardware and software elements. In embodiments that use software, the software may include but is not limited to firmware, resident software, microcode, etc.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A linear equalizer comprising:
   a plurality of input transistors coupled to input terminals of the linear equalizer and configured to receive input signals;
   a plurality of gain control transistors configured to be coupled to a supply voltage and coupled to the plurality of input transistors,
   wherein the plurality of gain control transistors are coupled to gain control terminals configured to receive gain control signals,
   wherein at least some of the gain control transistors are coupled to output terminals of the linear equalizer and configured to transmit output signals;
   a first impedance element coupled between a first transistor and a second transistor of the input transistors and a first fixed voltage;
   a second impedance element coupled between a third transistor and a fourth transistor of the input transistors and a second fixed voltage;
   wherein a peaking gain of the linear equalizer is defined by the gain control signals applied to the gain control terminals; and
   wherein the second impedance element includes a plurality of capacitors and an inductor.

2. The linear equalizer of claim 1,
   wherein the input terminals are coupled to control terminals of the input transistors and
   wherein the gain control terminals are coupled to control terminals of the gain control transistors.

3. The linear equalizer of claim 1, further comprising
   a first capacitor coupled to a first node between a first pair of the gain control transistors and a first transistor of the plurality of input transistors,
   the first capacitor also being coupled to a second node between a second pair of the gain control transistors and a second transistor of the plurality of input transistors.

4. The linear equalizer of claim 3, further comprising
   a second capacitor coupled to the first node and
   a fixed voltage and a third capacitor coupled to the second node and the fixed voltage.

5. The linear equalizer of claim 4,
   wherein the second and third capacitors are variable capacitors.

6. The linear equalizer of claim 1,
   wherein the first impedance element includes a plurality of resistors that are coupled in series from the first transistor of the plurality of input transistors to the second transistor of the plurality of input transistors.

7. The linear equalizer of claim 6,
   wherein at least one of the plurality of resistors is a variable resistor.

8. The linear equalizer of claim 6,
wherein the second impedance element includes a plurality of additional resistors that are coupled to the third and the fourth transistors of the plurality of input transistors.

9. The linear equalizer of claim 8,
wherein at least some of the capacitors and the inductor are coupled in series from the third transistor of the plurality of input transistors to the fourth transistor of the plurality of input transistors.

10. The linear equalizer of claim 9,
wherein at least some of the additional resistors and at least one of the capacitors are coupled in series from the third transistor of the plurality of input transistors to the fourth transistor of the plurality of input transistors, and parallel to the at least some of the capacitors and the inductor.

11. The linear equalizer of claim 10,
wherein some of the additional resistors are coupled in series from the third transistor of the plurality of input transistors to the fourth transistor of the plurality of input transistors, and parallel to the at least some of the additional resistors and at least one of the capacitors.

12. The linear equalizer of claim 11,
wherein at least one of the some of the additional resistors is a variable resistor.

13. The linear equalizer of claim 1, further comprising
a plurality of current sources coupled to the plurality of input transistors and to at least one fixed voltage.

14. A linear equalizer comprising:
a plurality of input transistors coupled to input terminals of the linear equalizer and configured to receive input signals;
a plurality of gain control transistors configured to be coupled to a supply voltage and coupled to the plurality of input transistors,
wherein the plurality of gain control transistors are coupled to gain control terminals configured to receive gain control signals,
wherein at least some of the gain control transistors are coupled to output terminals of the linear equalizer and configured to transmit output signals, each output terminal being also coupled to a termination resistor that is configured to be coupled to the supply voltage;
a plurality of current sources coupled between the plurality of input transistors and at least one fixed voltage;
first and second impedance elements coupled between at least some of the input transistors and the at least one fixed voltage,
wherein a peaking gain of the linear equalizer is defined by the gain control signals is configured to be applied to the gain control terminals; and
a first capacitor coupled to a first node between a first pair of the gain control transistors and a first transistor of the plurality of input transistors;
wherein the first capacitor is coupled to a second node between a second pair of the gain control transistors and a second transistor of the plurality of input transistors.

15. The linear equalizer of claim 14,
wherein the input terminals are coupled to control terminals of the input transistors and wherein the gain control terminals are coupled to control terminals of the gain control transistors.

16. The linear equalizer of claim 14, further comprising
a second capacitor coupled to the first node and a fixed voltage and a third capacitor coupled to the second node and the fixed voltage.

17. The linear equalizer of claim 14,
wherein the first impedance element includes a plurality of resistors that are coupled in series from a first transistor of the plurality of input transistors to a second transistor of the plurality of input transistors.

18. The linear equalizer of claim 17,
wherein the second impedance element includes a plurality of additional resistors, a plurality of capacitors and an inductor that are coupled to third and fourth transistors of the plurality of input transistors.

19. A linear equalizer comprising:
a plurality of input transistors coupled to input terminals of the linear equalizer and configured to receive input signals;
a plurality of gain control transistors configured to be coupled to a supply voltage and coupled to the plurality of input transistors,
wherein the plurality of gain control transistors are coupled to gain control terminals configured to receive gain control signals,
wherein at least some of the gain control transistors are coupled to output terminals of the linear equalizer and configured to transmit output signals;
first and second impedance elements coupled between at least some of the input transistors and at least one fixed voltage;
wherein a peaking gain of the linear equalizer is configured to be defined by the gain control signals applied to the gain control terminals;
a first capacitor coupled to a first node between a first pair of the gain control transistors and a first transistor of the plurality of input transistors;
wherein the first capacitor is coupled to a second node between a second pair of the gain control transistors and a second transistor of the plurality of input transistors.

* * * * *